(12) United States Patent
Ue

(10) Patent No.: US 7,786,647 B2
(45) Date of Patent: Aug. 31, 2010

(54) MICROMOTION MECHANISM AND MICROSCOPE APPARATUS HAVING MICROMOTION MECHANISM

(75) Inventor: Yoshihiro Ue, Hidaka (JP)

(73) Assignee: Olympus Corporation, Tokyo (JP)

( * ) Notice: Subject to any disclaimer, the term of this patent is extended or adjusted under 35 U.S.C. 154(b) by 62 days.

(21) Appl. No.: 12/174,240

(22) Filed: Jul. 16, 2008

(65) Prior Publication Data
US 2009/0021111 A1 Jan. 22, 2009

(30) Foreign Application Priority Data
Jul. 20, 2007 (JP) .............................. 2007-190033

(51) Int. Cl.
*H01L 41/09* (2006.01)
*H02N 2/00* (2006.01)
(52) U.S. Cl. ................................. 310/317; 310/316.01
(58) Field of Classification Search ............ 310/316.01, 310/317
See application file for complete search history.

(56) References Cited
U.S. PATENT DOCUMENTS
2005/0207004 A1* 9/2005 Tokunaga et al. ........... 359/383

2007/0114441 A1* 5/2007 Ue ......................... 250/440.11

FOREIGN PATENT DOCUMENTS
JP   2001-161081 A   6/2001
JP   2005-265996 A   9/2005

OTHER PUBLICATIONS

Reference Guide to Actuators for Precise Control Edited by Solid Actuator Study Group of Japan Technology Transfer Association (JTTAS) (With English translation).

* cited by examiner

*Primary Examiner*—Thomas M Dougherty
(74) *Attorney, Agent, or Firm*—Frishauf, Holtz, Goodman & Chick, P.C.

(57) ABSTRACT

A micromotion mechanism includes: a fixing base; a movable element supported by the fixing base and movable thereon; an ultrasonic actuator for relatively moving the movable element and the fixing base; and a control device for outputting a drive signal of the ultrasonic actuator. The drive signals of the ultrasonic actuator during the micromotion drive are two types of burst signals equal in frequency and different in phase, and amplitude of the start and end of each of the two burst signals changes, and the maximum amplitude of at least one of the two burst signals is lower than in the normal driving operation.

12 Claims, 13 Drawing Sheets

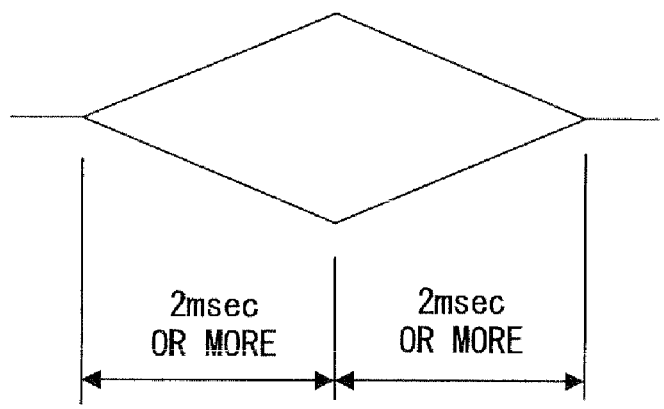
F I G. 5

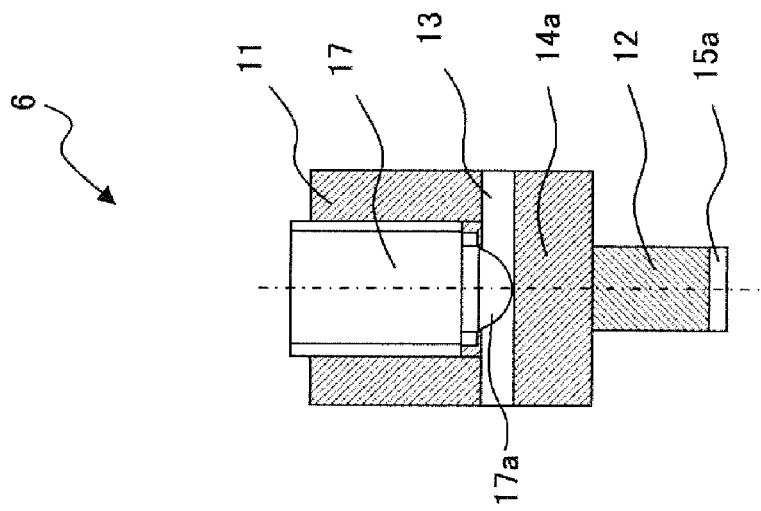
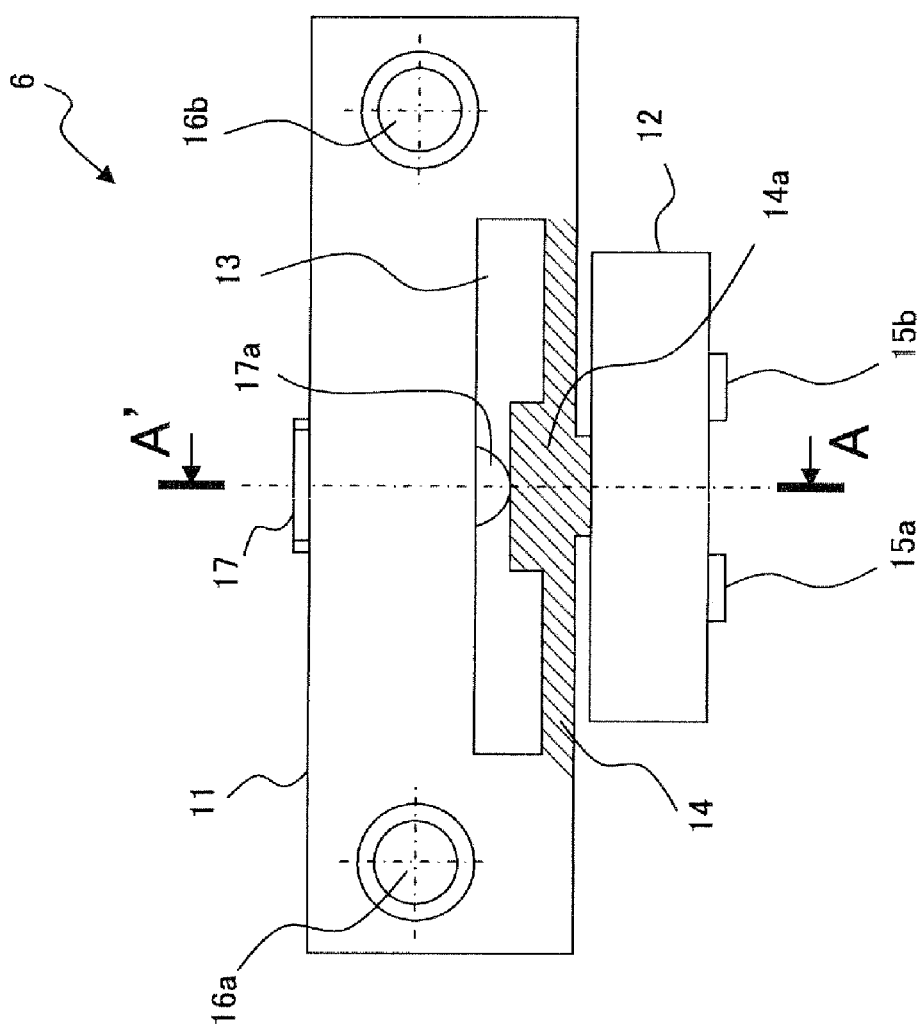
FIG. 8A
FIG. 8B

MICROMOTION MECHANISM AND MICROSCOPE APPARATUS HAVING MICROMOTION MECHANISM

CROSS REFERENCE TO RELATED APPLICATIONS

This application is based upon and claims the benefit of priority from the prior Japanese Patent Application No. 2007-190033, filed Jul. 20, 2007, the entire contents of which are incorporated herein by reference.

BACKGROUND OF THE INVENTION

1. Field of the Invention

The present invention relates to a micromotion mechanism having an ultrasonic motor and a microscope apparatus having the micromotion mechanism.

2. Description of the Related Art

A microscope is widely used in observing the microstructure of a semiconductor, a living body sample, etc. An XY stage is used in setting an optional position of an observation target for a microscopic observation. In this case, a feed resolution demanded for a microstructure to be observed and the stability in a static position are required. In addition, it is often necessary to observe plural positions of an observation object with high throughput and at a high speed.

One of the actuators corresponding to the above-mentioned requests is an ultrasonic motor. For example, as described in the patent document 1 (Japanese Published Patent Application No. 2005-265996), there is an apparatus proposed using an ultrasonic motor as an actuator of the XY stage for a microscope.

An example of the ultrasonic motor used for this stage is a rectangular parallelepiped linear driving ultrasonic actuator. Most of these ultrasonic motors is configured by a multi-player piezoelectric element, includes a electrode for flexural vibrations and a electrode for longitudinal vibrations, and is driven by applying sine wave signals 90° shifted to the respective electrodes.

FIG. 1 is a schematic diagram showing an example of a stage translation mechanism provided with the above-mentioned linear driving ultrasonic actuator.

In the example shown in FIG. 1, an ultrasonic motor 106 has an ultrasonic vibration element (hereinafter referred to simply as a vibration element) 105 including a multiplayer piezoelectric element having flexural vibration electrodes 101 (101a, 101b, 101c, 101d) and a longitudinal vibration electrode 102 and two drive elements 104 (104a, 104b). When a longitudinal vibration signal as a sine wave signal is applied to the longitudinal vibration electrode 102, and a flexural vibration signal as a sine wave signal 90° shifted from the longitudinal vibration signal is applied to the flexural vibration electrode 101, a movable element (stage) 108 moves along a guide 107.

In FIG. 1, the "+" or "−" sign of the flexural vibration electrode 101 and the longitudinal vibration electrode 102 indicate the polarization direction of the piezoelectric element. For example, when a plus voltage is applied to an electrode, a piezoelectric element of an electrode portion of a "+" sign deforms to be expanded in the longitudinal direction, and a piezoelectric element of an electrode portion of a "−" sign deforms to be reduced in the longitudinal direction. Therefore, when a sine wave signal is applied to the flexural vibration electrode 101, a flexural deforming vibration as shown by the schematic diagram in FIG. 2A is excited, and when a sine wave signal is applied to the longitudinal vibration electrode 102, a longitudinal vibration of expansion and reduction in the longitudinal direction as shown by the schematic diagram in FIG. 2B is excited. In FIGS. 2A and 2B, an arrow expressed by dotted lines indicates the direction of the deformation of the piezoelectric element. An arrow expressed by solid lines indicates the direction of the movement of the drive element 104. Thus, when the phases of two types of vibration are simultaneously excited with 90° shifted from each other, the drive element 104 vibrates to draw a locus of an oval (refer to the dotted lines shown in FIG. 1) as indicated by the arrow shown in FIG. 1. At this time, the friction can be reduced by the vertical component of the force generated when the drive element 104 touched the movable element 108, and the force of the horizontal component moves the movable element 108.

Recently, the observation magnification has been higher by the super-microstructure of an object to be observed in observing the line width of a semiconductor, a living body, etc., and drive resolution is required for a submicron order in the micromotion mechanism in which an observation sample is positioned.

To meet the above-mentioned needs, for example, the patent document 2 (Japanese Published Patent Application No. 2001-161081) proposes a driving method using a signal and intermittently having a burst waveform portion as a method of enhancing the precision in stop position by improving the drive resolution of an ultrasonic motor. However, when such signal is applied to an ultrasonic actuator, noise like that generated by metal occurs at the start (activation) and the end (stop) of a burst waveform portion (111 and 112) as shown by the schematic diagram in FIG. 3.

To suppress the generation of the noise, for example, the non-patent document 1 ("Guide to Precise Control of Actuator" edited by Solid-state Actuator Study Group of Japan Technology Transfer Association, p. 598-p. 601) proposes a method of long-time stepwise or continuously increasing or decreasing an amplitude until a waveform indicates the maximum amplitude or the amplitude reaches 0 as shown in FIG. 4 when a burst waveform signal is applied.

To perform micromotion drive using the above-mentioned burst waveform signal, it is necessary to reduce the number of burst waveforms. In the meantime, to prevent the noise from occurring, a burst waveform signal is to be applied for a predetermined time (several millisecond order). In the experiment performed by the Applicant of the subject patent application (hereinafter referred to simply as the "subject application"), at the start and end of the burst waveform signal, it is necessary to suppress the noise to gradually change the amplitude of the burst waveform signal respectively for 2 milliseconds or more. In this experiment, the frequency of the burst waveform signal is about 80 kHz. In this case, as indicated by the schematic diagram shown in FIG. 5, the total application time of the burst waveform signal is 4 (2+2) milliseconds by assuming that the number of waveforms at the maximum amplitude is 1. Thus, the number of burst waveforms is 300 or more. In addition, the amount of movement of the movable element is about 2 μm at this time.

SUMMARY OF THE INVENTION

The micromotion mechanism according to an aspect of the present invention includes: a fixing base; a movable element supported by the fixing base and movable thereon; an ultrasonic actuator for relatively moving the movable element and the fixing base; and a control device for outputting a drive signal of the ultrasonic actuator. With the configuration, the drive signals of the ultrasonic actuator during the micromotion drive are two types of burst signals equal in frequency and different in phase, and the time of the start and end of the two burst signals changes in amplitude, and the maximum amplitude of at least one of the two burst signals is lower than in the normal driving operation.

A microscope apparatus according to another aspect of the present invention includes the micromotion mechanism.

BRIEF DESCRIPTION OF THE DRAWINGS

FIG. 5 is a schematic diagram showing an example of a burst waveform signal when the number of waveforms is set to 1 at the maximum amplitude;

FIG. 8A is a top view of the ultrasonic actuator;

FIG. 8B is a sectional view of the ultrasonic actuator shown in FIG. 8A as a view of the section along AA';

DESCRIPTION OF THE PREFERRED EMBODIMENT

The embodiments of the present invention are described below with reference to the attached drawings.

First Embodiment

Figure 6:
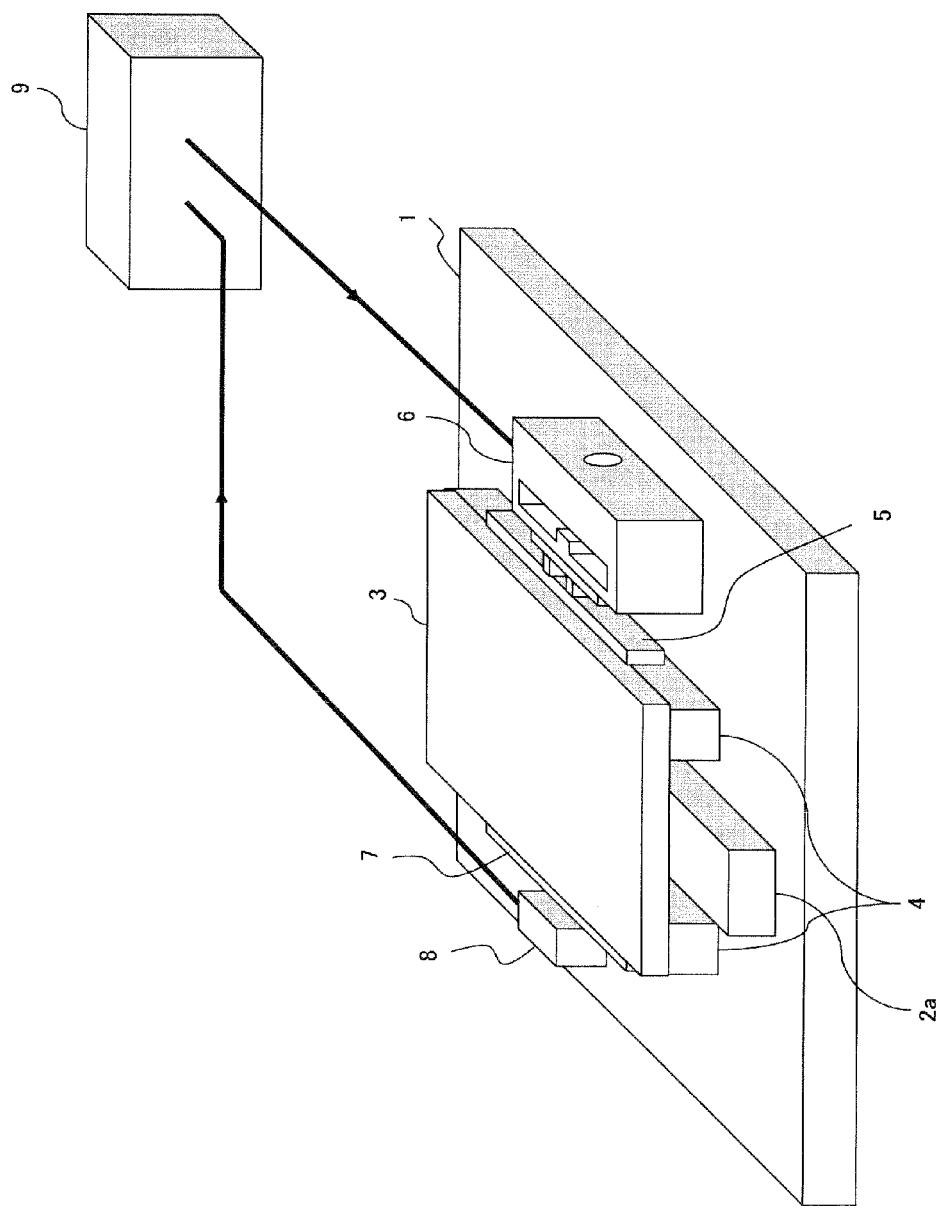
FIG. 6 is a perspective view of the schematic diagram showing the entire configuration of the micromotion mechanism according to the first embodiment of the present invention.
Figure 7B:
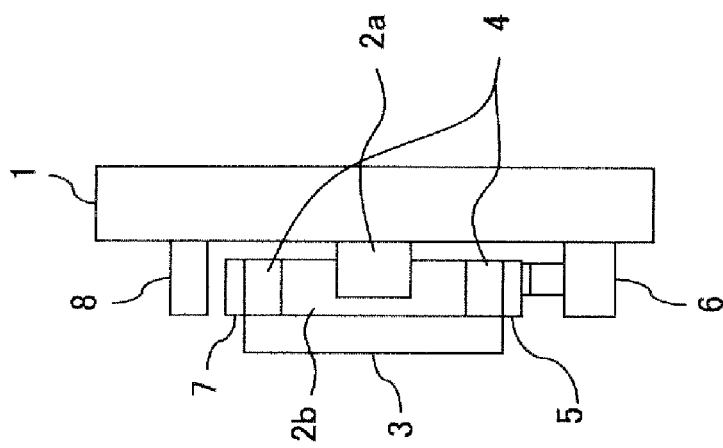
FIG. 7B is a side view of the micromotion mechanism shown in FIG. 7A.
Figure 7A:
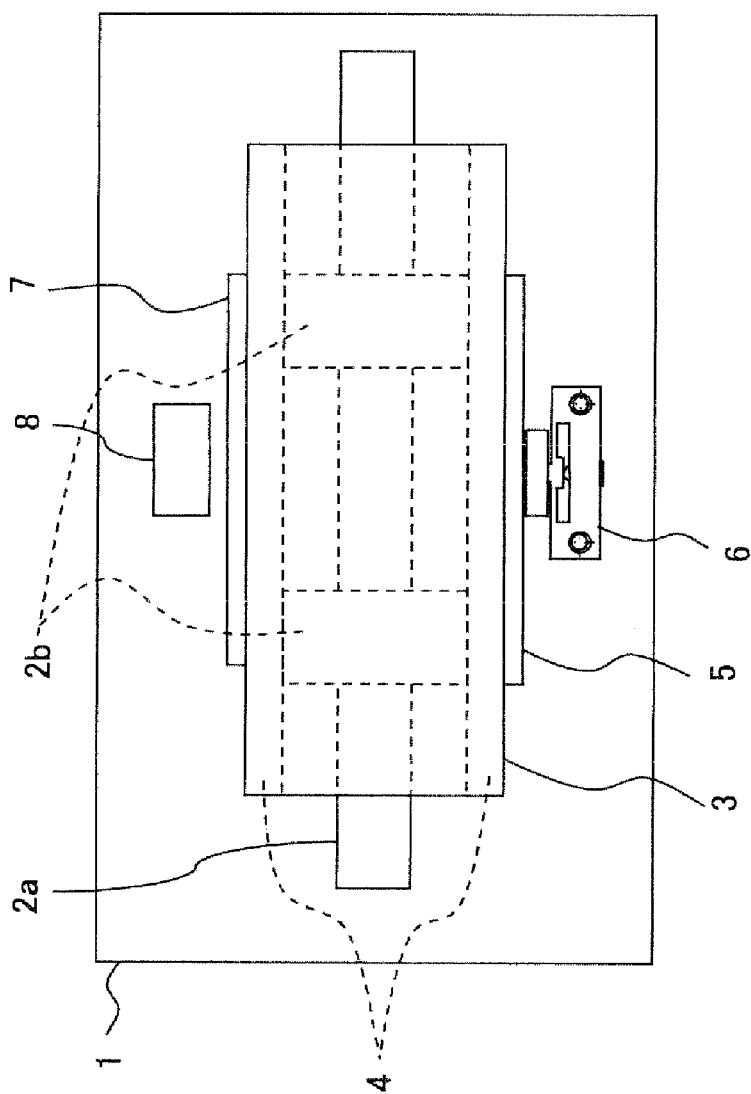
FIG. 7A is a partial top view of the micromotion mechanism according to the first embodiment of the present invention.

FIG. 6 is a schematic diagram as a perspective view of the entire configuration of the micromotion mechanism according to the first embodiment of the present invention. FIG. 7A is a partial top view of the micromotion mechanism. FIG. 7B is a side view of FIG. 7A. FIG. 7A is a partial perspective view of the micromotion mechanism.

In the micromotion mechanism according to the present embodiment shown in FIGS. 6, 7A and 7B, a guide 2 including a guide rail 2a of a ball circulation system and a guide blocks 2b is attached on a fixing base 1. The guide 2 includes two guide blocks 2b and one guide rail 2a as shown in FIG. 7A. The guide rail 2a is fixed on the fixing base 1, and a moving element 3 is fixed as a movable element on the guide blocks 2b. Below the moving element 3, two side members 4 are parallel to the guide rail 2a and contact the guide blocks 2b, and symmetric about the guide rail 2a.

The moving element 3 has a unitary construction with the guide blocks 2b and the side member 4, and supported as movable in the direction of one axis.

One of the side members 4 is provided with a sliding member 5 made a hard material such as ceramics etc.

An ultrasonic actuator 6 is fixed to the fixing base 1 by contacting and pressing against the sliding member 5. The ultrasonic actuator 6 relatively moves the moving element 3 and fixing base 1, and has a ultrasonic vibration element (hereinafter referred to simply as a vibration element) 12 described later as a rectangular parallelepiped vibration element for generating oval vibration at a contact position with an element to be driven using a flexural vibration and a longitudinal vibration.

On the other side on which the sliding member 5 of the moving element 3 is mounted, a scale 7 is provided, and an encoder 8 is provided at the position where a pattern of the scale 7 can be detected, and fixed to the fixing base 1. The encoder 8 is a displacement sensor for detecting the relative position between the moving element 3 and the fixing base 1.

It is desired that the arrangement of the guide blocks 2b is equal to or larger than the maximum amount of movement of the moving element 3. With the arrangement, although the moving element 3 moves, the pressing position of the ultrasonic actuator 6 is within the arrangement of the guide blocks 2b.

The position information is obtained from the encoder 8, and a control device 9 for driving the ultrasonic actuator 6 based on the position information is connected to the encoder 8 and the ultrasonic actuator 6.

FIG. 8A is a top view of the ultrasonic actuator 6. FIG. 8B is a sectional view of the ultrasonic actuator shown in FIG. 8A as a view of the section along AA'.

In the ultrasonic actuator 6 shown in FIGS. 8A and 8B, a holding member 11 is a holding mechanism for holding a vibration element 12 with respect to the fixing base 1, and is formed by a metal material such as aluminum. The holding member 11 holds a thin leaf spring 14 (portion indicated by the diagonal lines in FIG. 8A) formed by providing a notch portion 13 by wire discharging process etc. At the center of the thin leaf spring 14, a thick portion 14a not functioning as a spring is formed, and the thick portion 14a and the vibration element 12 are adhered with a hard adhesive such as a ceramic adhesive. At this time, the thin leaf spring 14 and the vibration element 12 are mounted such that they can be parallel to each other. The vibration element 12 is adhered around the central portion of the adhesion surface of the vibration element 12.

In the vibration element 12, two projections 15 (15a and 15b) are provided as a movable element on the reverse of the adhesion of the thick portion 14a of the holding member 11. The projections 15 are formed by a material including resin as a base material having a relatively low friction coefficient such as polyacetal including reinforced fiber, and ceramic. The holding member 11 is fixed to the fixing base 1 through fixing screw holes 16 (16a and 16b) with the two projections 15 contacting the sliding member 5. At this time, it is desired that there is almost no bending of the thin leaf spring 14 and the pressing force to the moving element 3 is nearly zero. In FIG. 6, the fixing screw holes 16 and screws for fixing the holding member 11 to the fixing base 1 are omitted.

A female screw is formed on the holding member 11. In detail, as shown in FIG. 8B, the thick portion 14*a* can be pressed by screwing the plunger 17 where a male screw is formed on the perimeter into the thick portion 14*a*. Although not shown in the attached drawings, the plunger 17 contains a coil spring, and the pressing force is generated by pushing a tip member 17*a*. Therefore, the pressing force depending on the amount of movement of the tip member 17*a* of the plunger 17 is loaded into the thick portion 14*a*. At this time, the vibration element 12 is also pushed with the projections 15 to the sliding member 5.

As the holding member 11, for example, the holding member described in the Japanese Patent Application No. 2007-16972 can be applied.

Figure 9:
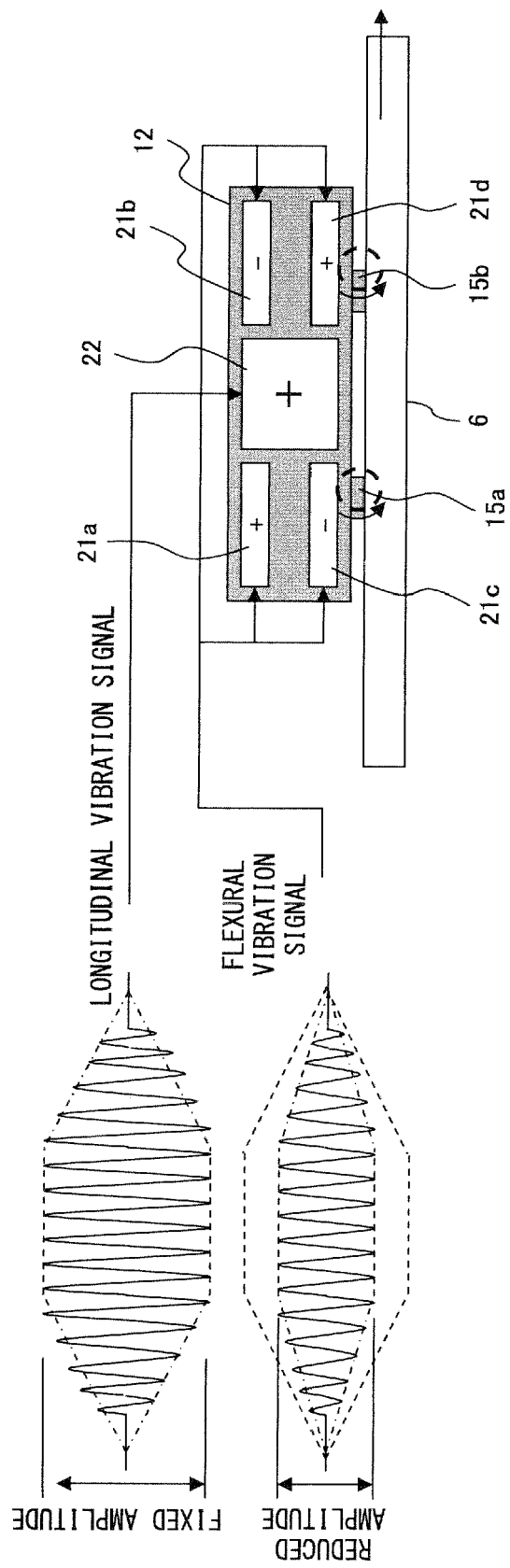
FIG. 9 is a schematic diagram showing an example of the drive signal output by the control device to the ultrasonic actuator (vibration element) during the micromotion drive.

FIG. 9 is a schematic diagram showing an example of the drive signal output by the control device 9 to the ultrasonic actuator 6 (vibration element 12) during the micromotion drive.

Figure 1:
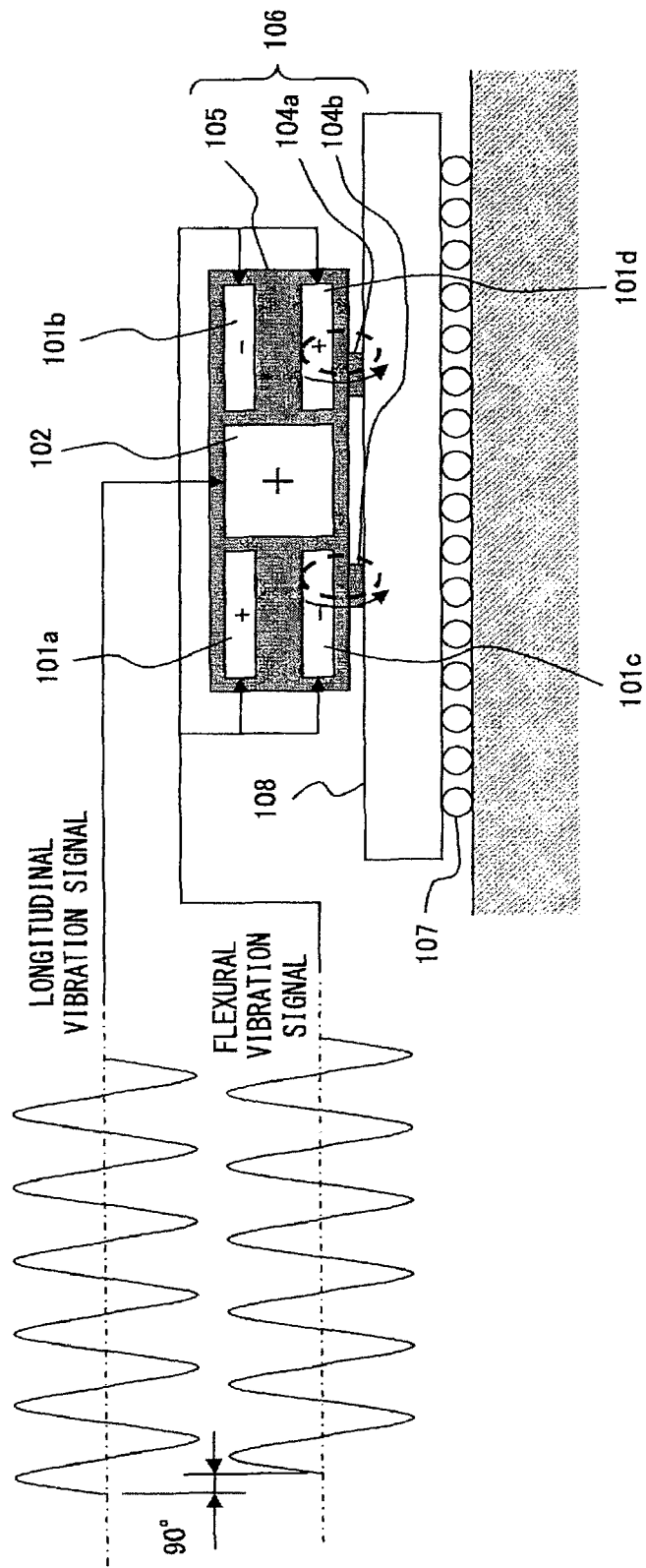
FIG. 1 is a schematic diagram showing an example of the stage translation mechanism provided with a linear driving ultrasonic actuator.
Figure 2:
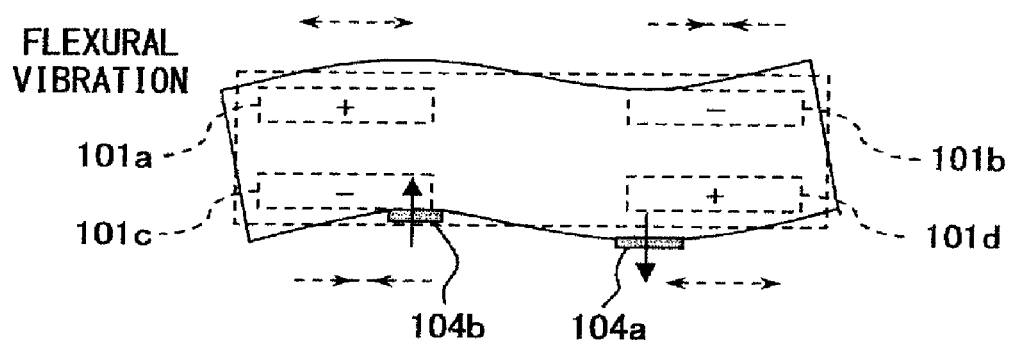
FIG. 2A is a schematic diagram of the state in which a flexural deforming vibration is excited.
FIG. 2B is a schematic diagram of the state in which a longitudinal vibration is excited.
Figure 2:
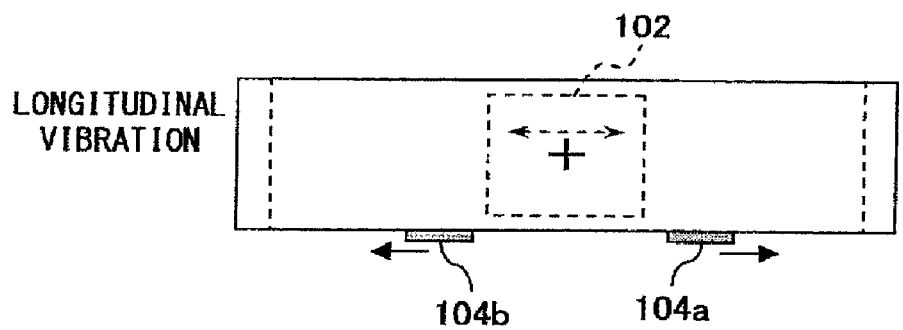
Figure 3:
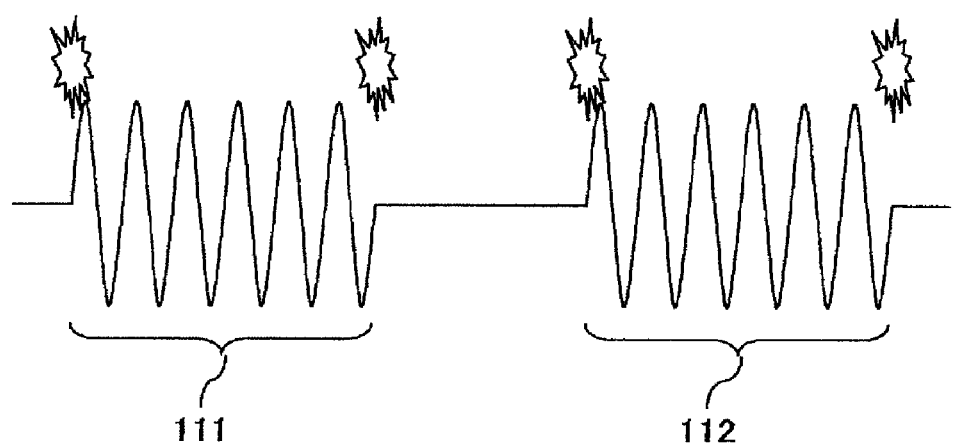
FIG. 3 is a schematic diagram showing an example of a signal intermittently having a burst waveform portion.
Figure 4:
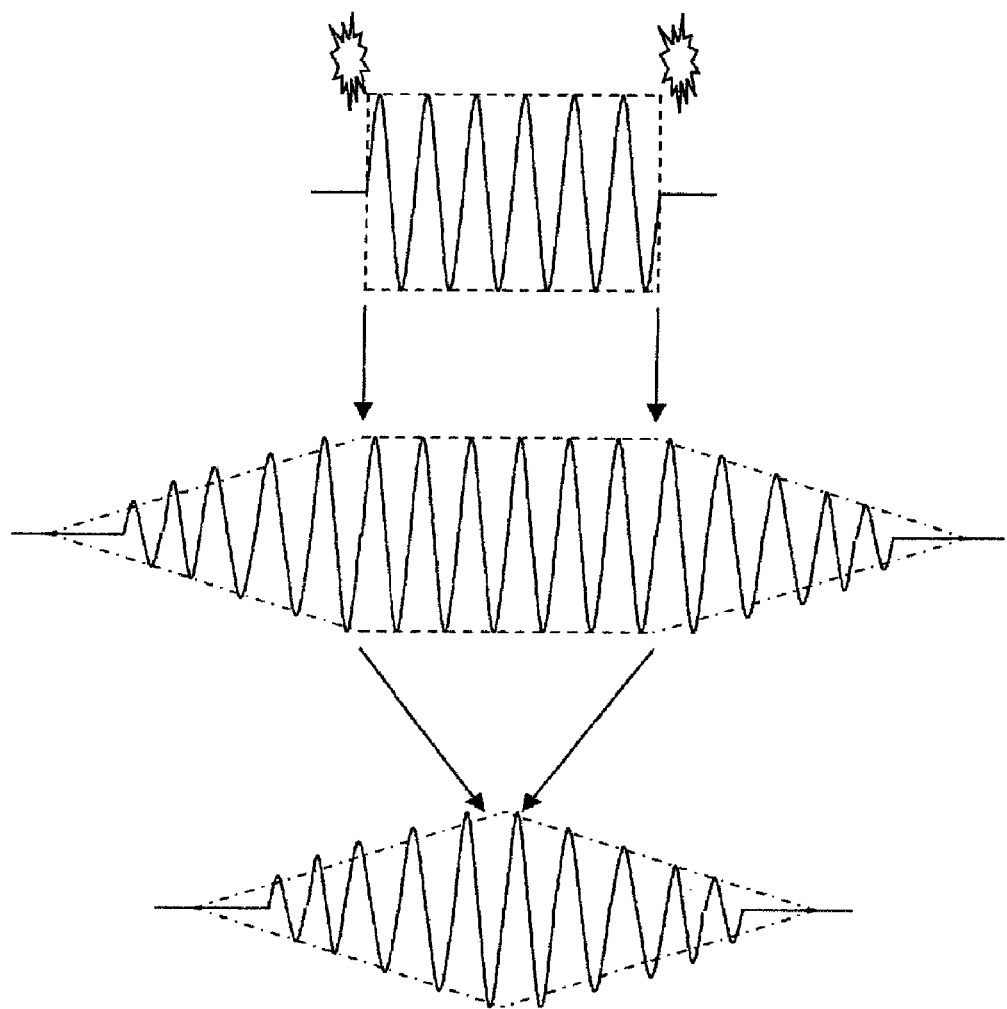
FIG. 4 is an explanatory view of a method of long-time stepwise or gradually increasing or decreasing the amplitude.

As shown in FIG. 9, the vibration element 12 has a similar configuration as the vibration element 103 shown in FIG. 1, and includes a multiplayer piezoelectric element having flexural vibration electrodes 21 (21*a*, 21*b*, 21*c*, 21*d*) and a longitudinal vibration electrode 22. The control device 9 can move the moving element 3 by micromotion by applying the flexural vibration signal and the longitudinal vibration signal as shown in FIG. 9 to the two types of the vibration element 12, that is, the flexural vibration electrode 21 and the longitudinal vibration electrode 22. At this time, there occurs a vibration drawing a locus of the oval (refer to the dotted lines shown in FIG. 9) indicated by the arrow shown in FIG. 9 as with the drive element 104 shown in FIG. 1, the friction is reduced by the vertical components of the force generated when the projections 15 touches the sliding member 6, and the sliding member 6 (moving element 3) is moved by the force of the horizontal component.

The flexural vibration signal is a burst signal for exciting a flexural vibration on the vibration element 12, and the longitudinal vibration signal is a burst signal for exciting a longitudinal vibration signal on the vibration element 12. The two types of burst signals are equal in frequency and different in phase. Amplitude of the start and end of the two burst signals temporally-changes, and the maximum amplitude of at least one of the two burst signals is lower than in the normal driving operation. The two types of burst signals are controlled like this. Under the control, since the vibration amplitude of the ultrasonic actuator 6 can be lower although the number of waveforms (number when the waveform for one period is 1) of the burst signal is large, the moving element 3 can be moved by micromotion in a submicron order.

In the example shown in FIG. 9, at the start of the flexural vibration signal and the longitudinal vibration signal, the amplitude stepwise or continuously changes from 0 to the maximum amplitude in a period of a several millisecond order, and at the end of the signals, the amplitude stepwise or continuously changes from the maximum amplitude to 0 in a period of a several millisecond order. The flexural vibration signal and the longitudinal vibration signal are controlled like this. Although the longitudinal vibration signal indicates the same waveform signal during the micromotion drive and the normal drive, the flexural vibration signal is controlled to have lower maximum amplitude of the signal during the micromotion drive than the maximum amplitude of the signal during the normal drive.

The above-mentioned flexural vibration signal and the longitudinal vibration signal can be generated by changing at least one of the voltage, current, and period. In the present embodiment, as an example, they are generated by changing a voltage. That is, the increase of the amplitude at the start of a signal, the decrease of the amplitude at the end of the signal, and the value of the maximum amplitude are determined by changing the voltage. In his case, the increase and the decrease of the amplitude at the start and the end of the signal can be performed by various methods of linearly changing a voltage, changing it according to a sine wave, etc., but the effect of suppressing the generation of noise appears around 2.5V of a voltage change per millisecond, and the occurrence of the noise can be considerable suppressed when the voltage change per millisecond is 1V or less. Therefore, it is desired that the amount of voltage change at the start and the end of the signal is 2.5V/msec or less, and the amount of 1V/msec or less is more preferable.

In addition, during the micromotion drive, as described above, the maximum amplitude of at least one of the flexural vibration signal and the longitudinal vibration signal is controlled to be lower than in the normal driving operation. In this case, the selection of a signal for the maximum amplitude lower than in the normal driving operation can be a flexural vibration signal and a longitudinal vibration signal, only a flexural vibration signal, or only a longitudinal vibration signal. In any selection method, the micromotion drive can be performed. However, according to the experiment by the applicant, as clearly indicated by the experiment data shown later in FIG. 10, it assumed that the maximum amplitude of only the flexural vibration signal as lower than in the normal driving operation.

Figure 10:
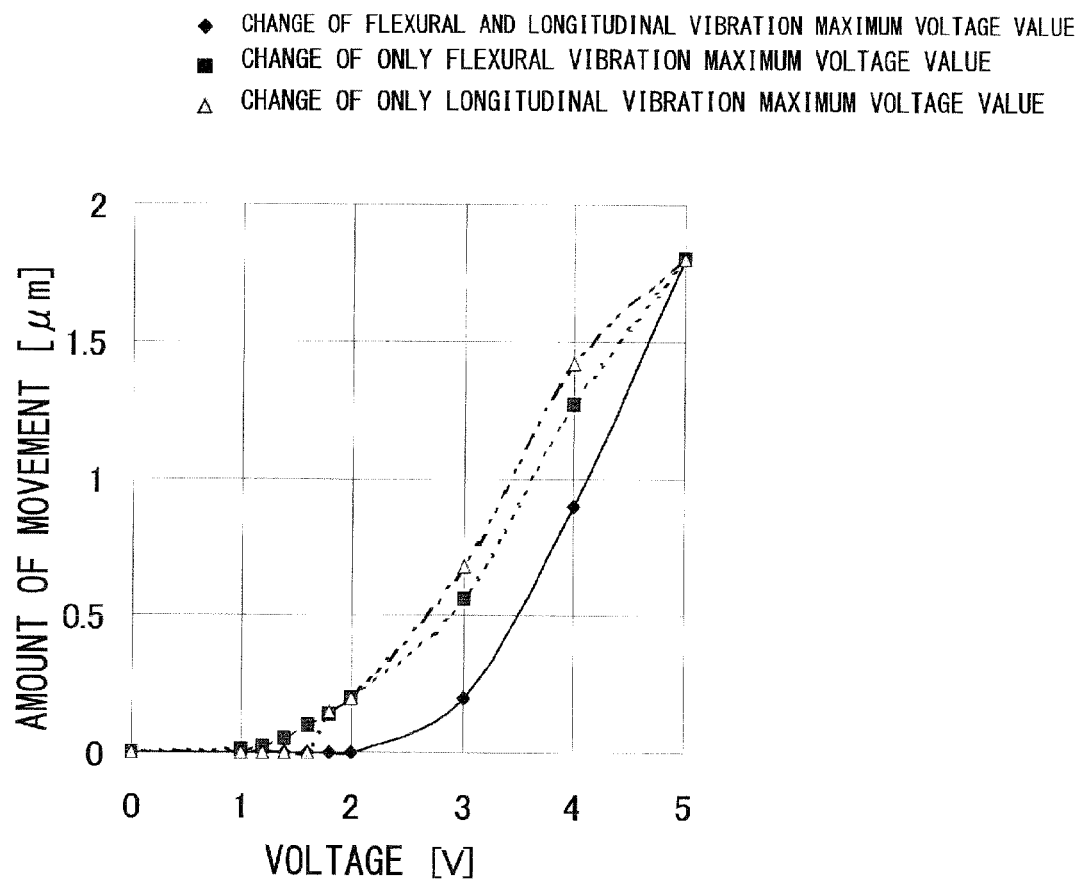
FIG. 10 shows the experiment data.

FIG. 10 shows the experiment data. In this experiment, the maximum amplitude of the burst signal is changed by changing the voltage.

In FIG. 10, the horizontal axis indicates a voltage value corresponding to the maximum amplitude of the burst signal whose maximum amplitude is changed, and the vertical axis indicates the amount of movement of the moving element 3 in one output of the burst signal of each of the flexural vibration signal and the longitudinal vibration signal. The mark "♦" shown in FIG. 10 indicates the data when the maximum amplitudes of both flexural vibration signal and longitudinal vibration signal are changed. The mark "■" indicates the data when the maximum amplitude of only the flexural vibration signal is changed. The mark "▲" indicates the data when the maximum amplitude of only the longitudinal vibration signal is changed.

As clearly indicated by the experiment data shown in FIG. 10, when the maximum amplitudes of both flexural vibration signal and longitudinal vibration signal are changed (refer to the mark "♦" shown in FIG. 10), the movement amount change to the voltage change becomes large, and the micromotion resolution becomes lower when the voltage resolution is fixed. When the maximum amplitude of only the longitudinal vibration signal is changed (refer to the mark "▲" shown in FIG. 10), the phenomenon that the moving element 3 suddenly stops when the voltage is 2V or less. Therefore, it is not preferable to stable perform the micromotion. Therefore, the experiment result reports that it is optimum to change the maximum amplitude of only the flexural vibration signal. Therefore, according to the present embodiment, as shown in FIG. 9, the maximum amplitude of only the flexural vibration signal is controlled to be lower than in the normal driving operation. Thus, the movement amount change of the moving element 3 to the voltage change corresponding to the maximum amplitude of the burst signal whose maximum amplitude is controlled to be lower than in the normal driving operation becomes moderate, and the amount of micromotion can be easily adjusted (micromotion resolution is improved), and the micromotion drive can be stably obtained.

On the other hand, during the micromotion drive, the correlation between the amount of movement and the voltage value corresponding to the maximum amplitude of the burst signal whose maximum amplitude is controlled to be lower than in the normal driving operation is easily changed by a contact state change between the ultrasonic actuator 6 and the moving element 3 when the moving element 3 moves, and an ambient environment change. Thus, at the micromotion drive, the control device 9 constantly acquires the correlation between the voltage value corresponding to the maximum amplitude of the burst signal controlled lower than in the normal driving operation in the burst signals of the flexural vibration signal and longitudinal vibration signal output to the ultrasonic actuator 6 and the actual amount of movement of the moving element 3 by the flexural vibration signal and the longitudinal vibration signal, and, based on the correlation, can control to correct the voltage value corresponding to the maximum amplitude of the burst signal controlled to be lower than in the normal driving operation in the burst signals of the flexural vibration signal and the longitudinal vibration signal output to the ultrasonic actuator 6.

Figure 11A:
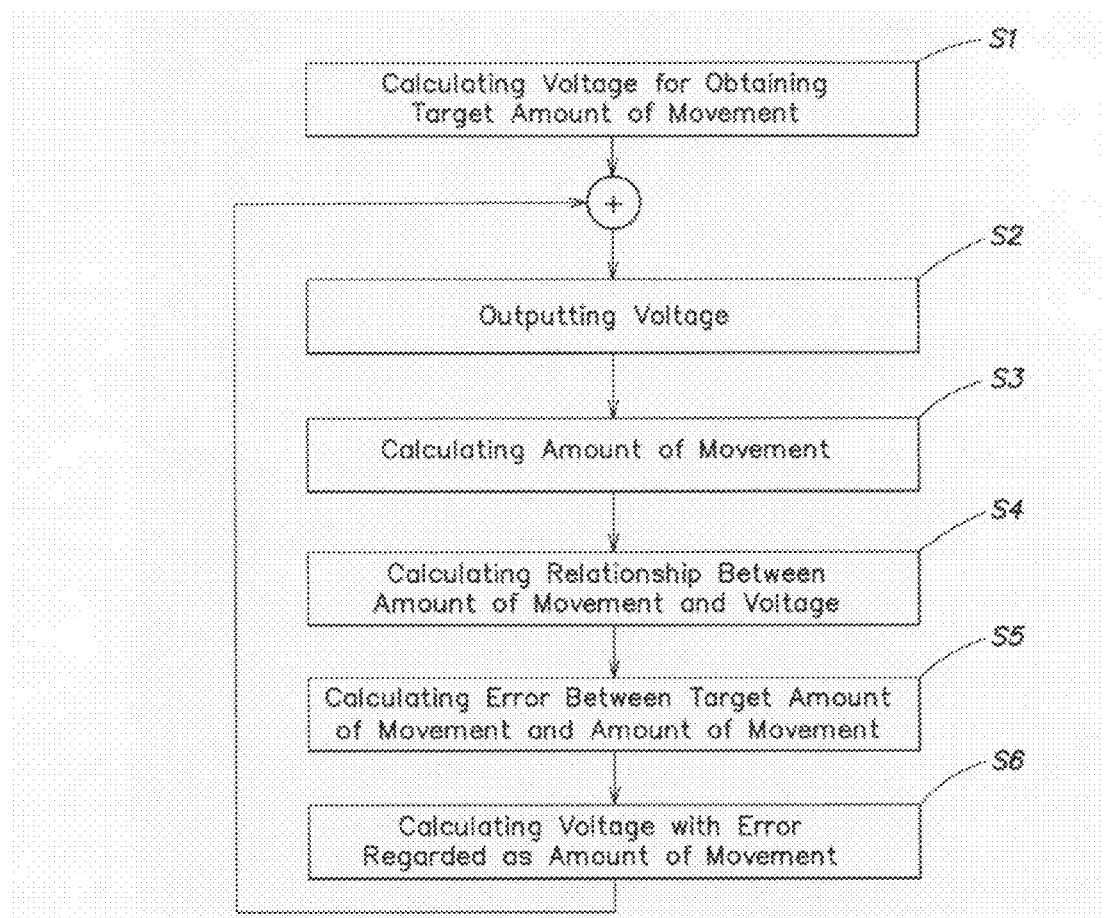
FIG. 11A is a flowchart of a correcting operation.

FIG. 11A is a flowchart showing the correcting operation. The flowchart shows the operation performed once per one output of the burst signals of the flexural vibration signal and the longitudinal vibration signal. Therefore, the flowchart is repeatedly executed for each output.

In the flowchart shown in FIG. 11A, a voltage value $V_t[V]$ for obtaining a target movement amount $y_t[\mu m]$ by one output of the burst signals of the flexural vibration signal and the longitudinal vibration signal is calculated (step (hereinafter referred to as "S") 2). The voltage value $V_t[V]$ corresponds to the maximum amplitude of the burst signal controlled to be lower than in the normal driving operation. Assuming that the initial coefficient $a_i[\mu m/V]$ indicates the correlation between the voltage value $V_t[V]$ and the target movement amount $y_t[\mu m]$, the following equation (1) holds.

$$V_t = y_t/a_i \quad (1)$$

Then, the voltage value b[V] calculated in the previous S6 described later is added to the voltage value $V_t[V]$, and one output of the burst signals of the flexural vibration signal and the longitudinal vibration signal is performed using the voltage value $(V_t+b)[V]$ as a voltage value corresponding to the maximum amplitude of the burst signal controlled to be lower than in the normal driving operation (S2). However, if the process in S6 has not been performed yet, the process is performed using the voltage value b[V] as 0[V].

Next, the actual amount of movement $y_r[\mu m]$ of the moving element 3 by one output of the burst signals of the flexural vibration signal and the longitudinal vibration signal is calculated based on the output of the encoder 8 (S3).

Then, the coefficient $a_r[\mu m/V]$ expressing the correlation between the actual amount of movement $y_r[\mu m]$ calculated in S3 and the voltage value $(V_t+b)$ [V] obtained in S2 is calculated (S4). The coefficient $a_r[\mu m/V]$ can be obtained by the following equation (2).

$$a_r = y_r/(V_t+b) \quad (2)$$

Next, an error $E[\mu m]$ between the target movement amount $y_t[\mu m]$ and the actual amount of movement $y_r[\mu m]$ calculated in S3 is calculated (S5). The error $E[\mu m]$ can be obtained by the following equation (3).

$$E = y_t - y_r \quad (3)$$

Then, the voltage value b[V] is obtained using the error $E[\mu m]$ obtained in S5 as an amount of movement (S6). The voltage value b[V] is an amount of correction for the voltage value corresponding to the maximum amplitude of the burst signal controlled to be lower than in the normal driving operation, and can be obtained by the following equation (4).

$$b = E/a_r \quad (4)$$

Afterwards, the voltage value b[V] obtained in S6 is added to the voltage value $V_t[V]$ calculated in S1, control is returned to S2, and the next output of the burst signals of the flexural vibration signal and the longitudinal vibration signal is performed. Subsequently, the above-mentioned processes are repeated.

In the above-mentioned correcting operation, although the correlation between the voltage value corresponding to the maximum amplitude of the burst signal controlled to be lower than in the normal driving operation and the amount of movement changes by a contact state change between the ultrasonic actuator 6 and the moving element 3 and a change of an ambient environment, the correlation is constantly corrected, and the drive of a desired small amount can be performed.

The correlation between the voltage value corresponding to the maximum amplitude of the burst signal controlled to be lower than in the normal driving operation and the amount of movement can be obtained by, as described above, calculating the inclination "a" of a straight line as a linear approximation, and storing the correlation as a table having data of plural points in advance and interpolating the data between a point and a point stored as data with a straight line. When the correlation is stored as a table, a voltage value (corresponding to the maximum amplitude of the burst signal controlled to be lower than in the normal driving operation in the burst signals of the flexural vibration signal and the longitudinal vibration signal output to the ultrasonic actuator 6) and an amount of movement (by one output of the burst signals of the flexural vibration signal and the longitudinal vibration signal output to the ultrasonic actuator 6) are obtained, a difference between the obtained result and the data in the table corresponding to the obtained result is obtained, and the difference can be added to all data in the table. In this method, a more precise voltage value movement amount conversion can be performed.

In the present embodiment, since a desired experiment result can be obtained in the linear approximation method, the linear approximation method is adopted. When the linear approximation method is adopted, the inclination "a" of the straight line can be a value obtained by obtaining a weighted average from the values of "a" in the several previous operations. In this case, a sudden change can be moderated, and stable micromotion drive can be performed.

Figure 11B:
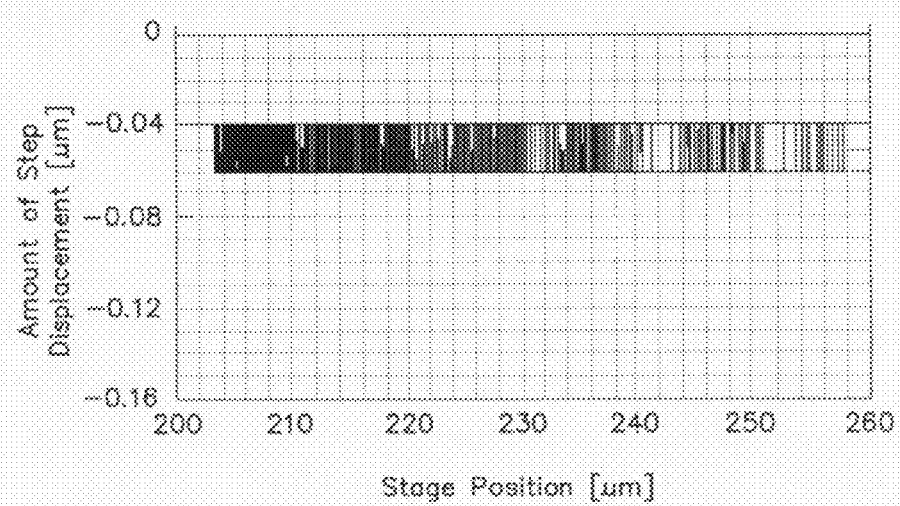
FIG. 11B shows an experiment result indicating the relationship between the stage position (position of a moving element) and the amount of step displacement when the micromotion drive is actually performed according to the flowchart shown in FIG. 11A.

FIG. 11B shows an experiment result indicating the relationship between the stage position (position of the moving element 3) and the amount of step displacement when the micromotion drive is actually performed according to the flowchart shown in FIG. 11A. The amount of step displacement indicates the amount of movement of the moving element 3 by one output of the burst signals of the flexural vibration signal and the longitudinal vibration signal. As shown in FIG. 11B, in any stage position, a stable amount of step displacement is obtained within the range of $-0.04\ \mu m \sim -0.06\ \mu m$.

As described above, according to the micromotion mechanism of the present embodiment, an occurrence of noise can be suppressed during the drive by a burst signal, and micromotion feed can be performed in a submicron order.

Additionally, in the micromotion mechanism according to the present embodiment, when the maximum amplitudes of the burst signals of the flexural vibration signal and the longitudinal vibration signal are simultaneously increased or decreased, a change in amount of movement of the moving element 3 to a change in maximum amplitude is sharp. Based on this, there can be a method of controlling the moving speed of the moving element 3 by changing the maximum amplitude. In this case, as described above, the traceability of the moving speed control can be improved, and the occurrence of noise can be suppressed by changing the amplitude (maximum amplitude) for a prolonged time period. The change of the maximum amplitude of the burst signal can be changed by, for example, changing a voltage. In this case, it is appropriate to set the amount of voltage change to 2.5 V/msec or more preferable to 1 V/msec. The control can also be applied when a signal other than the burst signal (for example, a continuous signal) is applied.

In the micromotion mechanism according to the present embodiment, the pressing position of the ultrasonic actuator 6 is kept with high rigidity in the direction of pressure by the pressing force of the ultrasonic actuator 6 in the moving element 3 by the rolling element provided within the operation range of the moving element 3 or supporting both ends of the moving element 3, thereby reducing the fluctuation of the pressing force when the moving element 3 moves. Therefore, the fluctuation by a change of the pressing force during the micromotion drive can be reduced, and the stability can be improved.

Furthermore, in the micromotion mechanism according to the present embodiment, a ball circulating guide is adopted for the guide 2, there is no problem of cage shift etc.

Second Embodiment

Figure 12:
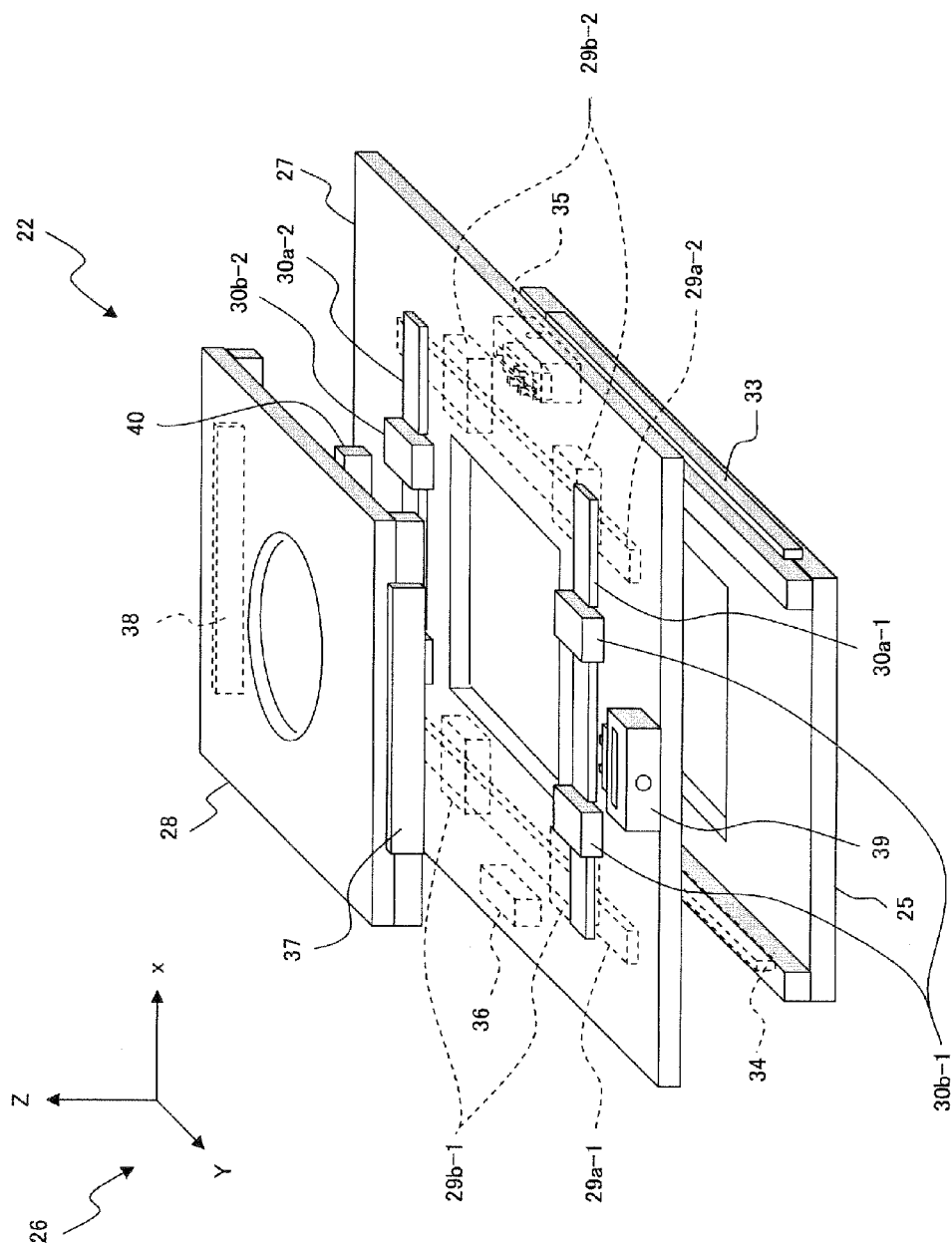
FIG. 12 is schematic diagram as a partial perspective view of an XY stage provided for the microscope apparatus according to the second embodiment of the present invention.
Figure 13:
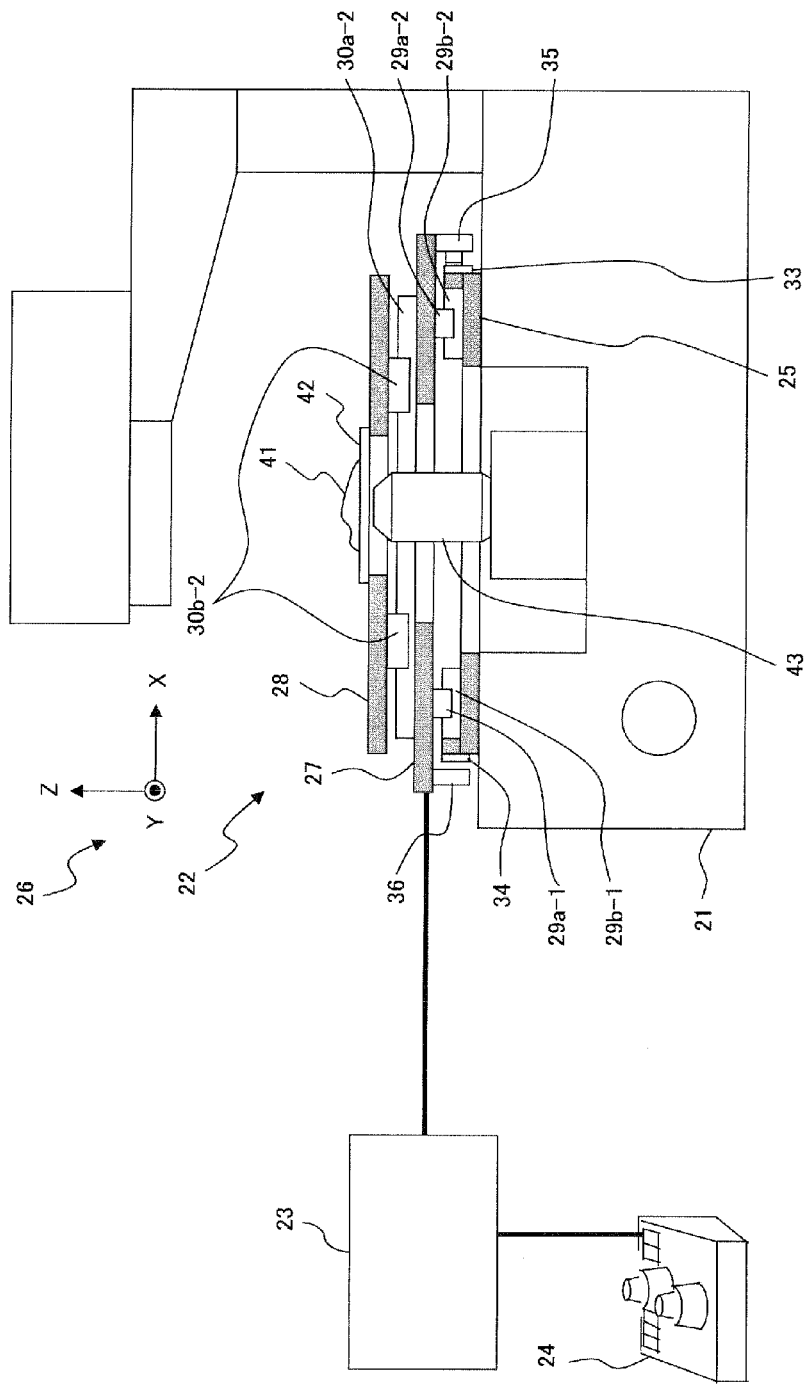
FIG. 13 is a schematic diagram as a partial sectional view of the entire configuration of the microscope apparatus according to the second embodiment of the present invention.

FIG. 12 is a schematic diagram as a partial perspective view of the XY stage provided for the microscope apparatus according to the second embodiment of the present invention. FIG. 13 is a schematic diagram as a partial sectional view of the entire configuration of the microscope apparatus according to the present embodiment.

In the microscope apparatus according to the present embodiment shown in FIGS. 12 and 13, a XY stage 22 is attached to a microscope 21. The XY stage 22 is connected to a control device 23 for control of the operation by a command from an operation device 24 and a PC (personal computer) not shown in the attached drawings. The operation device 24 is provided with a rotation handle for operability of the conventional microscope stage. The operation device 24 is also provided with a plurality of SWs for assignment of the functions according to user need such as storage of a stage position, a movement of the stage to a stored stage position, etc. Therefore, basic operations can be performed without connection to the PC.

The XY stage 22 is configured by a fixing base 25 having an aperture at the center, a Y table 27 supported by the fixing base 25 as movable in the Y direction (refer to a coordinate system 26) and having an aperture at the center, an X table 28 supported by the Y table 27 as movable in the X direction (refer to the coordinate system 26) and having an aperture at the center, a Y guide 29 having Y guide rails 29a (29a-1, 29a-2) arranged parallel to each other over an aperture and Y guide blocks 29b (29b-1, 29b-2), an X guide 30 having X guide rails 30a (30a-1, 30a-2) supporting the X table 28 with respect to the Y table 27 as movable in the X direction and parallel to each other over an aperture, and X guide blocks 30b (30b-1, 30b-2), a Y sliding plate 33 parallel to the Y guide rails 29a on the side of the fixing base 25, a Y scale 34 parallel to the Y guide rails 29a on the side opposite the Y sliding plate 33 on the fixing base 25, a Y actuator 35 (ultrasonic actuator) fixed to press the Y sliding plate 33 onto the Y table 27, a Y encoder 36 fixed to the Y table 27 to face the Y scale 34, an X sliding plate 37 parallel to the X guide rails 30a on the side of the X table 28, an X scale 38 parallel to the X guide rails 30a on the side opposite the side of the X sliding plate 37 of the X table 28, an X actuator 39 (ultrasonic actuator) fixed to the Y table 27 to press the X sliding plate 37, and an X encoder 40 fixed to the Y table 27 to face the X scale 38. The X guide rails 30a is fixed to the upper surface of the Y table 27, and the Y guide rails 29a is fixed to the lower surface of the Y table 27. The X guide blocks 30b is fixed to the lower surface of the X table 28, and the Y guide blocks 29b is fixed to the upper surface of the fixing base 25.

The fixing base 25 is fixed to the microscope 21, and a sample plate 42 on which a sample 41 is placed is arranged on the X table 28.

An objective lens 43 is arranged through the aperture provided for the fixing base 25, the Y table 27, and the X table 28.

In the microscope apparatus having the above-mentioned configuration, the X actuator 39 and the Y actuator 35 has a configuration similar to that of the ultrasonic actuator 6 described according to the first embodiment of the present invention. As with the control device 9 described with reference to the first embodiment, the control device 23 controls the movement (for example, micromotion feed) of the X table 28 by outputting the burst signals of the flexural vibration signal and the longitudinal vibration signal to the X actuator 39, and also controls the movement (for example, micromotion feed) of the Y table 27 by outputting the burst signals of the flexural vibration signal and the longitudinal vibration signal to the Y actuator 35. At this time, as in the correcting operation (refer to FIG. 11A) described above with reference to the first embodiment, the control device 23 can correct and control the signal output to the X actuator 39 based on the output of the X encoder 40, and can correct and control the signal output to the Y actuator 35 based on the output of the Y encoder 36.

As described above, according to the microscope apparatus of the present embodiment, as with the first embodiment of the present invention, when a burst signal is used in a driving operation, an occurrence of noise can be suppressed, and micromotion feed in a submicron order can be performed. Therefore, although the sample 41 to be observed is fine and the objective lens 43 is a high magnification objective lens such as 100× (100×), micromotion drive can be realized for the resolution or higher. Therefore, a user who performs a microscope observation can correctly set a position in which the observation is performed without a stress from unpleasant noise.

The present invention has been described in detail above, but the present invention is not limited to the embodiments above, and can be realized by various improvements and modifications within the scope of the gist of the present invention.

As described above, the micromotion mechanism having an ultrasonic actuator and the microscope apparatus having the micromotion mechanism according to the present invention can suppress an occurrence of noise when a driving operation is performed using a burst signal, and can perform micromotion feed in a submicron order.

The invention claimed is:
1. A micromotion mechanism, comprising:
a fixing base;

a movable element which is supported by the fixing base, and which is movable thereon;

an ultrasonic actuator which has a vibration element in rectangular parallelepiped form for generating an oval vibration at a contact portion with an object to be driven using a flexural vibration and a longitudinal vibration, and which relatively moves the movable element and the fixing base; and a control device which outputs drive signals to the ultrasonic actuator;

wherein the drive signals comprise a burst signal that is a drive signal for the flexural vibration and a burst signal that is a drive signal for the longitudinal vibration, said burst signals being equal in frequency and different in phase, wherein an amplitude of a start and end of the burst signal for the flexural vibration and the burst signal for the longitudinal vibration temporally-changes, and wherein a maximum amplitude of one of the burst signal for the flexural vibration and the burst signal for the longitudinal vibration is lower than in a normal driving operation.

2. The micromotion mechanism according to claim 1, further comprising:

a displacement sensor which detects a relative position between the movable element and the fixing base;

wherein the control device outputs the drive signal of the ultrasonic actuator based on an output of the displacement sensor.

3. The micromotion mechanism according to claim 1, wherein the amplitude of the start and end of each of the burst signal of the flexural vibration and the burst signal of the longitudinal vibration change stepwise or continuously in a time of several millisecond order.

4. The micromotion mechanism according to claim 1, wherein:

the maximum amplitude of the burst signal for the flexural vibration is lower than in the normal driving operation.

5. The micromotion mechanism according to claim 2, wherein the control device obtains a correlation between: (i) the maximum amplitude of the burst signal which is lower than in the normal driving operation and output to the ultrasonic actuator, and (ii) an actual amount of movement of the movable element which is obtained based on the output of the displacement sensor, and wherein the control device corrects the maximum amplitude of the burst signal which is lower than in the normal driving operation and output to the ultrasonic actuator based on the obtained correlation.

6. A microscope apparatus having the micromotion mechanism according to claim 1.

7. A microscope apparatus having the micromotion mechanism according to claim 2.

8. A microscope apparatus having the micromotion mechanism according to claim 3.

9. A microscope apparatus having the micromotion mechanism according to claim 4.

10. A microscope apparatus having the micromotion mechanism according to claim 5.

11. The micromotion mechanism according to claim 4, wherein the maximum amplitude of the burst signal for the longitudinal vibration is not changed, and only the maximum amplitude of the burst signal for the flexural vibration is changed.

12. A microscope apparatus having the micromotion mechanism according to claim 11.

* * * * *